(12) United States Patent
Moutard

(10) Patent No.: US 8,121,230 B2
(45) Date of Patent: Feb. 21, 2012

(54) CORRECTION OF MISMATCHES BETWEEN TWO I AND Q CHANNELS

(75) Inventor: Arnaud Moutard, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 1610 days.

(21) Appl. No.: 11/481,559

(22) Filed: Jul. 5, 2006

(65) Prior Publication Data

US 2008/0170651 A1  Jul. 17, 2008

(30) Foreign Application Priority Data

Jul. 6, 2005  (FR) ...................................... 05 07215

(51) Int. Cl.
| | |
|---|---|
| H03D 1/04 | (2006.01) |
| H03D 1/06 | (2006.01) |
| H03K 5/01 | (2006.01) |
| H03K 6/04 | (2006.01) |
| H04B 1/10 | (2006.01) |
| H04L 1/00 | (2006.01) |
| H04L 25/08 | (2006.01) |

(52) U.S. Cl. ...................................................... 375/346
(58) Field of Classification Search .................. 375/346, 375/232
See application file for complete search history.

(56) References Cited

U.S. PATENT DOCUMENTS

| | | | | |
|---|---|---|---|---|
| 6,009,317 A | * | 12/1999 | Wynn ............................. | 455/296 |
| 2002/0110201 A1 | * | 8/2002 | Ozluturk et al. ............... | 375/332 |
| 2004/0156450 A1 | | 8/2004 | Auranen et al. ............... | 375/324 |
| 2004/0257480 A1 | | 12/2004 | Busson et al. ................. | 348/731 |
| 2005/0078776 A1 | * | 4/2005 | Song et al. ..................... | 375/345 |
| 2006/0107183 A1 | * | 5/2006 | Ejima et al. ................... | 714/758 |

FOREIGN PATENT DOCUMENTS

| | | |
|---|---|---|
| EP | 1 168 597 A1 | 1/2002 |
| FR | 2853486 | 10/2004 |
| WO | WO 2004/025826 A1 | 3/2004 |

* cited by examiner

*Primary Examiner* — David C. Payne
*Assistant Examiner* — Tanmay Shah
(74) *Attorney, Agent, or Firm* — Seed IP Law Group PLLC

(57) ABSTRACT

A method for correcting mismatches between a digital signal in phase and a digital signal in quadrature originating from a signal broadcast by terrestrial channel, comprising a phase correction method. A set of first error values is measured during a first period. A current value of a second error is determined based on a sum of the first error values. The current value is compared with a previous second error value stored in memory. The value of a current phase shift correction is chosen from two phase shift correction values, based on the result of the comparison and the value of a previous phase shift correction. The value of the chosen current phase shift correction is added to the previous phase shift to obtain a current phase shift. This current phase shift is introduced between the digital signal in phase and the digital signal in quadrature.

24 Claims, 6 Drawing Sheets

CORRECTION OF MISMATCHES BETWEEN TWO I AND Q CHANNELS

BACKGROUND OF THE INVENTION

1. Field of the Invention

The disclosure relates to the correction of mismatches on I and Q signals originating from signals broadcast by terrestrial channel.

The disclosure also applies in particular to the field of digital terrestrial television, for example as defined in the European DVB-T (Digital Video Broadcasting-Terrestrial) specification, or in the DVB-H (Digital Video Broadcasting-Handheld) specification.

The disclosure may also be applied to the field of digital broadcasting, as defined, for example, in the DAB (Digital Audio Broadcasting) standard.

The disclosure may equally be applied to the field of wireless local area networks, such as, for example, are defined in the IEEE 802.11 or Hiperlan/2 standards.

The disclosure relates in particular to demodulators and processing of the received broadcast signals.

2. Description of the Related Art

As a general rule, in high bit-rate communications, transmissions are limited among other things by the distortion of the signal during propagation. The data may be dispersed in time, thus creating inter-symbol interference.

Furthermore, a signal broadcast by terrestrial channel may be reflected on an obstacle during transmission. The obstacle may, for example, be a wall, a building or a relief element. The broadcast signal may also be subject to a refraction due to the index of a medium passed through, or even be diffracted against an obstacle. Consequently, the signal received by a receiver is the combination of a signal transmitted over a direct path from a sender and a multitude of attenuated and delayed signals originating from the different indirect paths.

The transfer function of such a channel may thus not be flat frequency-wise. Furthermore, the obstacles, the sender or the receiver may be mobile. The transfer function may thus change over time.

The use of an OFDM (Orthogonal Frequency Division Multiplexing) modulation is known. Transmission is handled by means of a frequency-division multiplexing of sub-carriers orthogonal to each other, separated by a guard interval. The modulation step involves an inverse Fourier transform and the demodulation step involves a fast Fourier transform (FFT). The OFDM modulation allows transmitting signals over a radio frequency channel with a relatively high reliability.

In particular, a COFDM (Coded OFDM) modulation may be used. The COFDM modulation allows providing a transmission that is relatively robust against the attenuations that may affect the sub-carriers.

A radio signal reception device comprises a tuner. The tuner allows replacing the signal received in the appropriate frequency band. The tuner may thus replace the signal received about an intermediate frequency, or even directly in the baseband. In the latter case, the tuner may be implemented in CMOS or BiCMOS technology. The tuner may thus have a relatively small size and consumption, which may be particularly interesting for DVB-H applications.

The tuner transforms the received signal into a signal in phase, denoted I (for In phase) and a signal in quadrature, denoted Q, respectively on an I channel and on a Q channel. The I signal and the Q signal are analogue. Mismatches between the I and Q channels may appear. The mismatches comprise phase defects, i.e., the phase shift between the vectors corresponding to the I signal and to the Q signal is not exactly 90°. The mismatches also comprise amplitude defects, i.e., the vectors corresponding to the I and Q signals have different lengths.

The patent application FR2853486 discloses a device comprising a baseband tuner, digitization means and a digital block. In addition to demodulation means, the digital block comprises correction means. These correction means are intended to correct the phase and amplitude mismatches of the I and Q channels. The patent application FR2853486 refers to known algorithms for correcting the phase and amplitude mismatches.

For example, an error is measured and a corrective phase shift to be introduced between the signals of the I and Q channels is calculated based on this error.

However, these algorithms have proved unsatisfactory when it comes to correcting mismatches on I and Q signals originating from signals broadcast by terrestrial channel.

BRIEF SUMMARY OF THE INVENTION

One embodiment of the present invention is to provide a correction of the mismatches on I and Q signals originating from signals broadcast by terrestrial channel that is more satisfactory.

An embodiment of the invention is thus a method for correcting mismatches between a digital signal in phase and a digital signal in quadrature originating from a signal broadcast by terrestrial channel, comprising a phase correction method comprising /a/ measuring a set of first error values during a first period, each value being measured based on an estimated symbol originating from the broadcast signal and the theoretical symbol nearest to the estimated symbol, /b/ determining a current value of a second error based on a sum of the first error values of the set of first error values, /c/ comparing the current second error value with a previous second error value stored in memory, /d/ choosing the value of a current phase shift correction to be added to a previous phase shift introduced between the digital signal in phase and the digital signal in quadrature, the choice being made from at least two phase shift correction values, based on the result of the comparison of the step /c/ on the one hand, and the value of a previous phase shift correction stored in memory on the other hand, /e/ adding the current phase shift correction value chosen in the step /d/ to the previous phase shift to obtain a current phase shift, /f/ introducing the current phase shift obtained in the step /e/ between the digital signal in phase and the digital signal in quadrature, /g/ storing in memory the current second error value determined in the step /b/ and the current phase shift correction value chosen in the step /d/, /h/ repeating the above steps.

Thus, according to this method, the second error is used as decision criterion to converge towards the correct value of the angle between the I and Q channels.

The method according to an embodiment of the invention is relatively simple to implement and provides for a correction of the mismatches between the I and Q channels originating from signals broadcast by terrestrial channels that is relatively effective.

Furthermore, such a channel is likely to change over time, such that by periodically repeating the steps of the method, a better correction of the phase mismatches may be obtained.

Embodiments of the invention are not limited by the order in which the steps /a/, /b/, /c/, /d/, /c/, /e/, /f/, /g/ and /h/ are presented. For example, the steps /e/ and /g/ are interchangeable.

Advantageously, the method for correcting mismatches may also comprise an amplitude correction method.

Advantageously, in one embodiment in the step /d/ the choice of the current phase shift correction value is made from two phase shift correction values.

The current second error value is compared with the previous second error value. The result of the comparison of the step /c/ may, for example, comprise the sign of the difference between the current second error value and the previous second error value stored in memory. This comparison step allows estimating whether the second error increased when the previous phase shift correction was added, or if, on the contrary, the second error diminished.

Advantageously, the two phase shift correction values may be of signs opposite to each other.

Thus, in the first case, the value of the current phase shift correction may be chosen to be equal to, or at least of the same sign as, the previous phase shift correction value. In the second case, the current phase shift correction value may be chosen to be opposite, or at least of the opposite sign, to the previous phase shift correction value.

In an alternate embodiment, in the step /d/, the choice of the current phase shift correction value is made from more than two phase shift correction values. This alternative may, in particular, be envisaged for a channel with a transfer function that varies relatively little over time. The method thus automatically exploits the speed of convergence.

Advantageously, the phase correction method may comprise a step /i/ consisting in waiting for a second period. This step is performed after the step /e/ of introducing a current phase shift and before measuring the first error values used to determine a next second error value. The waiting allows a device implementing the method according to this aspect of an embodiment of the invention to settle in a steady state after the introduction of the current phase shift. The next value of the second error is thus indicative of the effect of the current phase shift.

Alternatively, an embodiment of the phase correction method does not comprise a step for waiting during a second period. In practice, it is possible for the device implementing the method according to this aspect of the invention to present a relatively low inertia, such that there is no need to wait during the second period to obtain meaningful results.

Advantageously, in one embodiment the first period is such that the set of first error values comprises at least four first error values.

In practice, the channel transfer function may be liable to vary over time. It may therefore be desirable to measure a certain number of first error values in order to obtain a meaningful current second error value.

Alternatively, the first period is such that the set of first error values comprises less than four first error values.

Another subject of an embodiment of the present invention is a device for correcting mismatches between a digital signal in phase and a digital signal in quadrature, respectively on a channel in phase and a channel in quadrature, originating from a signal broadcast by terrestrial channel and intended for a device for estimating symbols based on the digital signal in phase and the digital signal in quadrature, the correction device including a phase correction device. The phase correction device comprises:

storing means for storing the value of a previous phase shift correction and the previous value of a second error, a measuring device to measure first error values between an estimated symbol and a theoretical symbol nearest to the estimated symbol, summing means for determining the current value of a second error based on a sum of the first error values measured during a first period, first comparison means for comparing the current second error value with the previous second error value stored in memory, choosing means to choose the value of a current phase shift correction to be added to a previous phase shift introduced between the digital signal in phase and the digital signal in quadrature, the choice being made from at least two phase shift correction values, based on the result of the comparison on the one hand, and on the previous phase shift correction value stored in memory, phase shifting means for introducing a current phase shift between the digital signal in phase and the digital signal in quadrature, the current phase shift being dependent on the previous phase shift and the current phase shift correction value.

An embodiment of a device for correcting mismatches allows implementing the method according to one of the embodiments of the invention and therefore presents the same advantages.

Furthermore, the device for correcting phase mismatches according to this aspect of an embodiment of the invention may be incorporated in an electronic device relatively easily.

The electronic device may, for example, comprise a demodulator.

In one embodiment, first counting means may control the summing means to enable the summing of the first error values during the first period. This characteristic is not limiting.

Alternatively, the first counting means may control the measurement device so that the first error value measurements are made only during the first period.

In one embodiment, second counting means may control the summing means to enable the summing of the first error values only after a second period. Thus, after having introduced a new phase shift, there is a wait for the electronic device to return to a steady state, for the current second error value to be meaningful.

Alternatively, the second counting means control the measurement device.

In one embodiment the electronic device may have a dynamic range such that it is not desirable to wait for the time of the second period to obtain a meaningful decision criterion.

In one embodiment channel estimation means are located upstream from the device for measuring first error values. Such channel estimation means, for example a predictor, are well known to those skilled in the art. The first errors are thus measured between theoretical symbols and estimated symbols, the estimating of the symbols including a correction step by the channel estimation means. In practice, some existing demodulators comprise an error measurement device downstream of a predictor. Such a phase correction device may therefore be inserted relatively easily in existing demodulators.

The method according to an aspect of an embodiment of the present invention is advantageously used when the electronic device according to an aspect of the invention is operating in a steady state condition.

Another embodiment of the present invention is an electronic device for processing components in phase and in quadrature, respectively on a channel in phase and a channel in quadrature, originating from signals broadcast by terrestrial channel, including a device for estimating symbols based on a digital signal in phase and a digital signal in quadrature respectively corresponding to the component in phase and the component in quadrature, and a device for correcting mismatches according to one aspect of the present invention.

Another embodiment of the present invention is a device for receiving signals broadcast by terrestrial channel including a tuner for replacing the signals received in baseband and outputting a component in phase on a channel in phase and a component in quadrature on a channel in quadrature, an electronic device according to one aspect of an embodiment of the invention for estimating symbols based on the components in phase and in quadrature.

Such a device for receiving broadcast signals may be relatively compact.

One embodiment of the invention is a system for correcting mismatches between a signal in phase and a signal in quadrature, comprising a memory configured to store historical signal correction data, an amplitude corrector, and a phase corrector. The phase corrector is configured to measure a plurality of first phase error values, generate a current second phase error value based on the first phase error values, and generate a current phase correction value based on the stored historical signal correction data and the current second phase error value. In one embodiment, the amplitude corrector is configured to measure an amplitude of one of the signal in phase and the signal in quadrature and generate an amplitude correction value based on the stored historical signal correction data and the measured amplitude.

One embodiment of the invention is a method for correcting mismatches between a signal in phase and a signal in quadrature comprising the steps of storing historical signal correction data in a memory, generating an amplitude correction value, and generating a phase correction value. The phase correction value is generated by measuring a plurality of first phase error values, calculating a second phase error value based on the first phase error values, and generating a current phase correction value based on the stored historical signal correction data and the second phase error value. In one embodiment, generating an amplitude correction value comprises measuring an amplitude of one of the signal in phase and the signal in quadrature and choosing a current amplitude correction value based on the measured amplitude and the stored historical signal correction data.

The method according to one embodiment may further comprise generating a subsequent phase correction value.

BRIEF DESCRIPTION OF THE SEVERAL VIEWS OF THE DRAWINGS

Other features and advantages of embodiments of the present invention will become apparent from the description that follows.

DETAILED DESCRIPTION OF THE INVENTION

Device for Receiving Broadcast Signals

Figure 1:
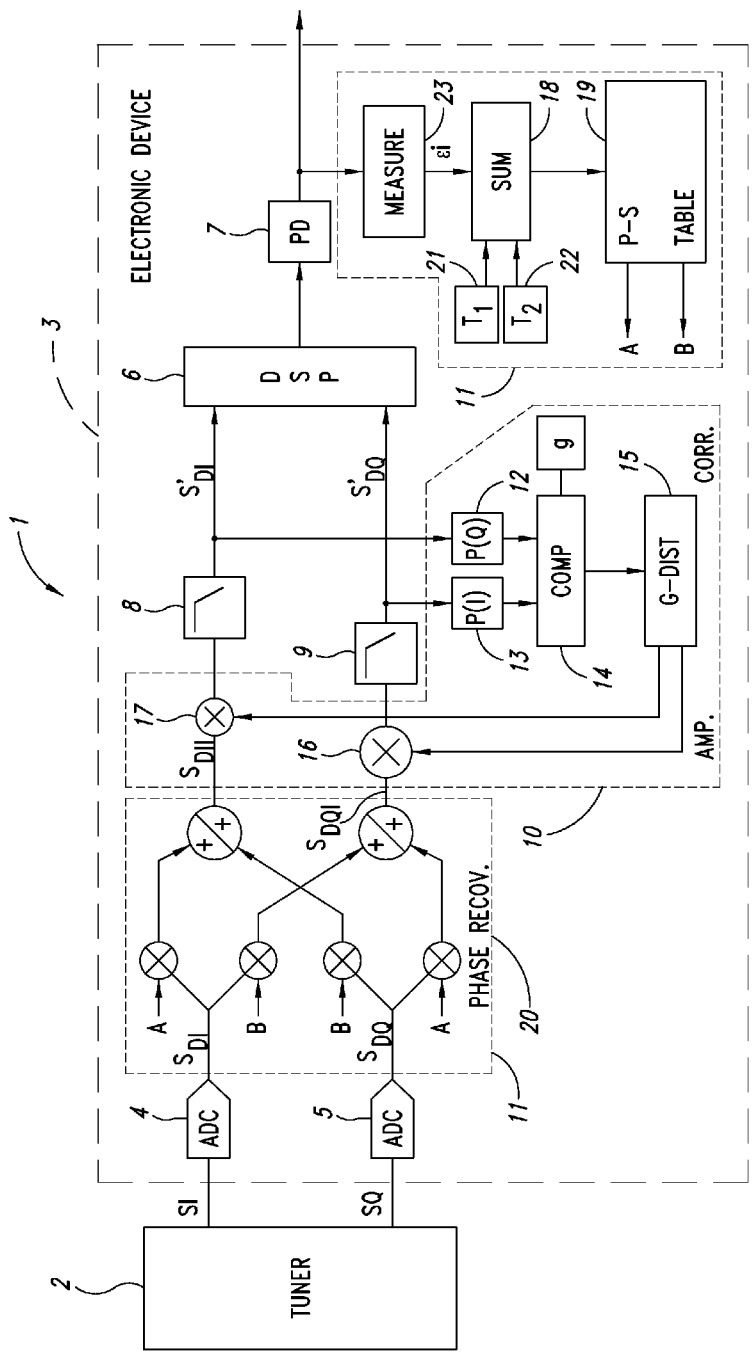
FIG. 1 is a diagram of an example of device for receiving broadcast signals according to an embodiment of the present invention.

The reception device 1 of FIG. 1 comprises a tuner 2 and an electronic device 3. The reception device 1 may be implemented in hybrid technology.

The tuner 2 allows receiving signals broadcast by a terrestrial channel and replace these signals in baseband. The broadcast signals are in this example modulated by a COFDM modulation. The electronic device 3 allows processing components in phase $S_I$ and in quadrature $S_Q$ originating from the signals replaced in baseband.

The electronic device represented comprises two analogue-digital converters (4, 5) for digitizing the components in phase $S_I$ and in quadrature $S_Q$, thus creating a digital signal in phase $S_{DI}$ and a digital signal in quadrature $S_{DQ}$.

The electronic device represented 3 also comprises a device for estimating symbols based on the digital signal in phase $S_{DI}$ and the digital signal in quadrature $S_{DQ}$. The symbol estimation device comprises a digital processing device 6 and digital low-pass filters (8, 9). These digital low-pass filters (8, 9) are used to provide a relatively selective filtering.

The digital processing device 6 demodulates a corrected signal in phase $S'_{DI}$ and a corrected signal in quadrature $S'_{DQ}$. The corrected signal in phase $S'_{DI}$ and the corrected signal in quadrature $S'_{DQ}$ respectively originate from the digital signal in phase $S_{DI}$ and the digital signal in quadrature $S_{DQ}$.

The digital processing device 6 may comprise a rotation device (not shown) to place the signals in baseband with a relatively high accuracy. The digital processing device 6 may also comprise a low-pass filter (not represented) and a fast Fourier transform device (not represented). A memory (not represented) may indicate the modulation method, for example QPSK (Quaternary Phase Shift Keying), 16-QAM (Quadrature Amplitude Modulation) or even 64-QAM.

The digital processing device 6 is known per se to those skilled in the art. The digital processing device 6 allows obtaining a constellation of symbols.

The electronic device 3 may also comprise an automatic gain control circuit (not represented) acting on the gain of amplifiers (not represented) upstream of the analogue-digital converters (4, 5). The automatic gain control circuit allows placing the amplitudes of the components in phase and in quadrature in a range of values such that the conversion is optimized.

The electronic device represented 3 also comprises channel estimation means, for example a predictor 7. The predictor 7 facilitates at least partially compensating for the effects of the channel on the symbols obtained.

The electronic device represented 3 also comprises a device for correcting mismatches between the digital signal in phase $S_{DI}$ and the digital signal in quadrature $S_{DQ}$. The device for correcting mismatches comprises an amplitude correction device 10 and a phase correction device 11.

Amplitude Correction Device and Method

Figure 4:
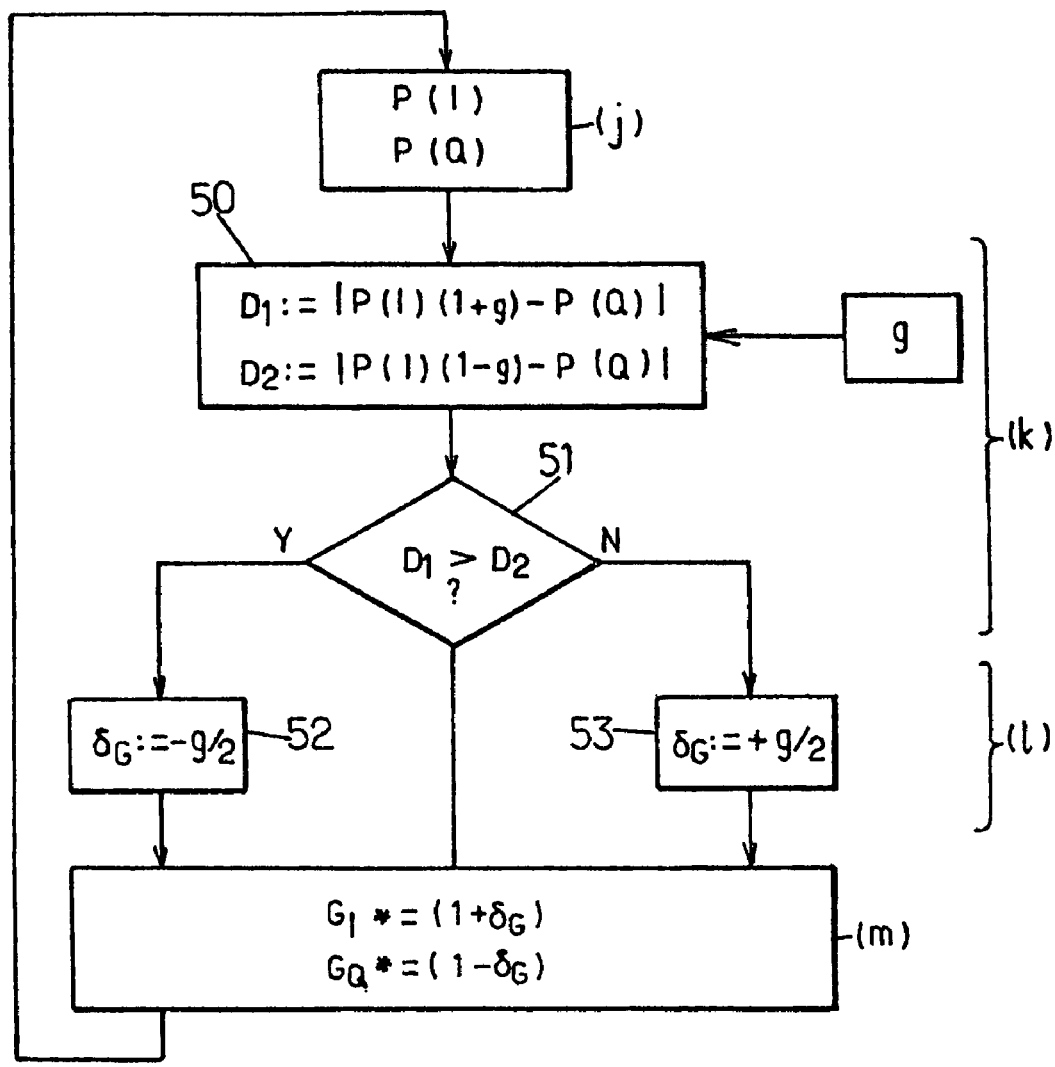
FIG. 4 shows an example of amplitude correction method, according to an embodiment of the present invention.

The amplitude correction device 10 of FIG. 1 and the example of amplitude correction method of FIG. 4 are described together.

The amplitude correction device 10 comprises, in this embodiment, two power calculation devices (12, 13), each power calculation device allowing to assess a power P(I) or P(Q) on one of the I or Q channels. Each power may be instantaneous, or averaged over a given period of time. For each channel, a power is assessed (step (j) in FIG. 4).

In the example of FIG. 1, the power calculation devices (12, 13) use an intermediate signal in phase $S_{DII}$ or an intermediate signal in quadrature $S_{DQI}$ according to the channel to which they are linked to estimate the power of this channel. The intermediate signal in phase $S_{DII}$ and the intermediate signal in quadrature $S_{DQI}$ originate from the digital signal in phase $S_{DI}$ and the digital signal in quadrature $S_{DQ}$.

The amplitude correction device 10 also comprises second comparison means 14 for comparing the duly assessed powers. This step, referenced (k) in FIG. 4, for comparing the powers assessed in the step (j), may be implemented in many ways.

For example, a gain interval g may be used to perform this comparison. The gain interval g may be programmed. One of the assessed powers, for example the power P(I) on the I channel, is first of all multiplied by a first factor, for example (1+g), before being compared with the other power, for example the power P(Q) on the Q channel. The power P(I) on the I channel is also multiplied by a second factor, for example (1−g), before being compared with the power P(Q) on the Q channel. A first difference D1, equal to |P(I)(1+g)−P(Q)| and a second difference D2, equal to |P(I)(1−g)−P(Q)| may, for example, be assessed (step 50 in FIG. 4). The first difference D1 is compared with the second difference D2 (step 51).

According to an alternative embodiment, the comparison of the powers does not involve a gain interval. The powers P(I) and P(Q) may, for example, be directly compared with each other.

Referring back to FIG. 1, a result of the comparison, for example the value of a Boolean variable, is transmitted to gain distribution means 15 linked to the second comparison means 14.

The gain distribution means 15 allow choosing a gain correction value $\delta_G$ from at least two gain correction values (step (l) in FIG. 4).

In one embodiment the gain correction value $\delta_G$ is chosen from strictly two values. In one embodiment the strictly two potential gain correction values have opposite signs. In one embodiment the absolute value of these two values are substantially equal, such as, for example, the values (−g/2, +g/2).

If the first difference D1 is less than the second difference D2, it may be considered that the power in the I channel is too low and the gain correction value chosen $\delta_G$ is then +g/2 (step 53 in FIG. 4).

If the first difference D1 is higher than the second difference D2, it may be considered that the power in the I channel is too high and the gain correction value chosen $\delta_G$ is then −g/2 (step 52 in FIG. 4).

The amplitude correction device 10 of FIG. 1 also comprises two multipliers (16, 17). Each multiplier (16, 17) is located on one of the channels upstream from the corresponding power calculation device (12, 13). Each multiplier allows applying a gain corresponding to the channel on which it is located.

For each of the channels, the current gain to be applied to this channel may be determined from a previous gain applied to this channel on the one hand, and from the chosen gain correction value $\delta_G$ (step (m) in FIG. 4). The gain of a multiplier 17 of the channel in phase is, for example, multiplied by a factor of approximately $(1+\delta_G)$. The gain of a multiplier 16 of the channel in quadrature is, for example, multiplied by a factor of approximately $(1-\delta_G)$. The gain of each multiplier is determined by the gain distribution means 15.

According to an alternative embodiment, the current gain to be applied to a channel is determined only for one of the channels. The current gain is determined on the basis of a previous gain applied to this channel on the one hand, and the gain correction value on the other hand. For example, only the gain of the multiplier 17 of the channel in phase is multiplied by a factor $(1+2^*\delta_G)$.

The power calculation devices (12, 13), the second comparison means 14, and the gain distribution means 15 may operate continuously. The steps (j), (k), (l), (m) and the current gain application step are thus repeated. The amplitude mismatches are thus corrected one step at a time.

In this example, the potential gain correction values (−g/2; +g/2) derive from the value of the gain interval g, but this may be arranged otherwise.

The absolute value of the gain correction may, for example, correspond to a gain of 0.17 dB.

It is also possible to allow for a number of possible absolute gain correction values, for example g/2 and 2g. Thus, a number of modes may be envisaged: for example, a slow mode, in which there is a relatively slow convergence towards a correction of the amplitude mismatches and a fast mode in which the convergence is faster. In slow mode, the gain of the multiplier 17 of the channel in phase may be multiplied by a factor $(1+g/2)$ or $(1-g/2)$. In fast mode, the gain of the multiplier 17 of the channel in phase may be multiplied by a factor $(1+2g)$ or $(1-2g)$. The slow mode may, for example, be adopted when the electronic device 3 operates in steady state condition. The fast mode may, for example, be adopted when the electronic device 3 is in transient state.

Amplitude correction devices other than the one represented may be used.

Phase Correction Device

The device for correcting mismatches may also comprise a phase correction device 11.

The phase correction device 11 comprises a device 23 for measuring first error values $\epsilon_i$ located downstream from the predictor 7. The first errors $\epsilon_i$ are measured between a symbol estimated by the digital processing device 6 and by the predictor 7, and a theoretical symbol nearest to the estimated symbol. The first error may comprise the distance between the point corresponding to the estimated symbol and the point corresponding to the theoretical symbol in a constellation.

Summing means 18 allow determining the current value of a second error based on a sum of the first error values measured $\epsilon_i$ during a first period $T_1$. The current second error value may, for example, be a sum, weighted if necessary, of the first measured errors $\epsilon_i$, or an average.

Moreover, the phase correction device 11 comprises storing means (not represented), for example a memory, to store the previous second error value and a previous phase shift correction.

First comparison means, in this case combined with the summing means 18, allow comparing the current second error value with the previous second error value. Choosing means, in this case combined with the summing means 18, allow choosing the value of a current phase shift correction from two phase shift correction values. The choice is made on the basis of a result of the comparison on the one hand, and the previous phase shift correction value stored in memory on the other hand.

The summing means 18, the first comparison means and the choosing means may be incorporated in a single processor.

Phase shifting means (19, 20) allow introducing a current phase shift between the digital signal in phase and the digital signal in quadrature. The current phase shift is dependent on the current phase shift correction value and a previous phase shift. The current phase shift is chosen to be equal to the previous phase shift plus the chosen phase shift correction. The phase shift increases or diminishes according to the sign of the chosen phase shift correction.

The phase shifting means may comprise a phase recovery circuit 20 and a table 19. The table 19 allows providing a first value A and a second value B on the basis of the desired phase shift. This first value A and this second value B are injected into the phase recovery circuit 20. For a phase shift value of $\phi$, the first value may be substantially equal to $\cos(\phi/2)/(2*\cos(\phi))$ and the second value may be substantially equal to $\sin(\phi/2)/(2*\cos(\phi))$. In practice, it is possible to provide for the phase shift to remain within a certain range, for example [−8°; +8°]. Since the phase shift is liable to vary discretely, with phase shift corrections for example of −1° or +1° only, the table 19 comprises an array of relatively reasonable size.

The phase shift corrections may also have absolute values that are higher or lower, for example 0.1 degrees.

This phase correction device allows converging towards an appropriate phase shift value.

The summing means 18 are in this case controlled by first counting means 21 and by second counting means 22.

The first counting means enable first measured errors $\epsilon_i$ to be summed during the first period $T_1$. The summing over a plurality of first error values allows taking up at least partially variations of the channel over time.

The second counting means 22 enable the summing after a certain time lapse corresponding to a second period $T_2$ has passed. This time lapse may enable the electronic device 3 to return to a steady state condition after the modification of the phase shift has been added. A new second error value is therefore established after this second period $T_2$.

The first period may, for example, be 1 ms, or even 8 s. The second period may also have various values, for example 10 ms.

In this example, the phase correction is performed before the amplitude correction. It may, of course, be otherwise.

Method for Correcting Phase Mismatches

Figure 2:
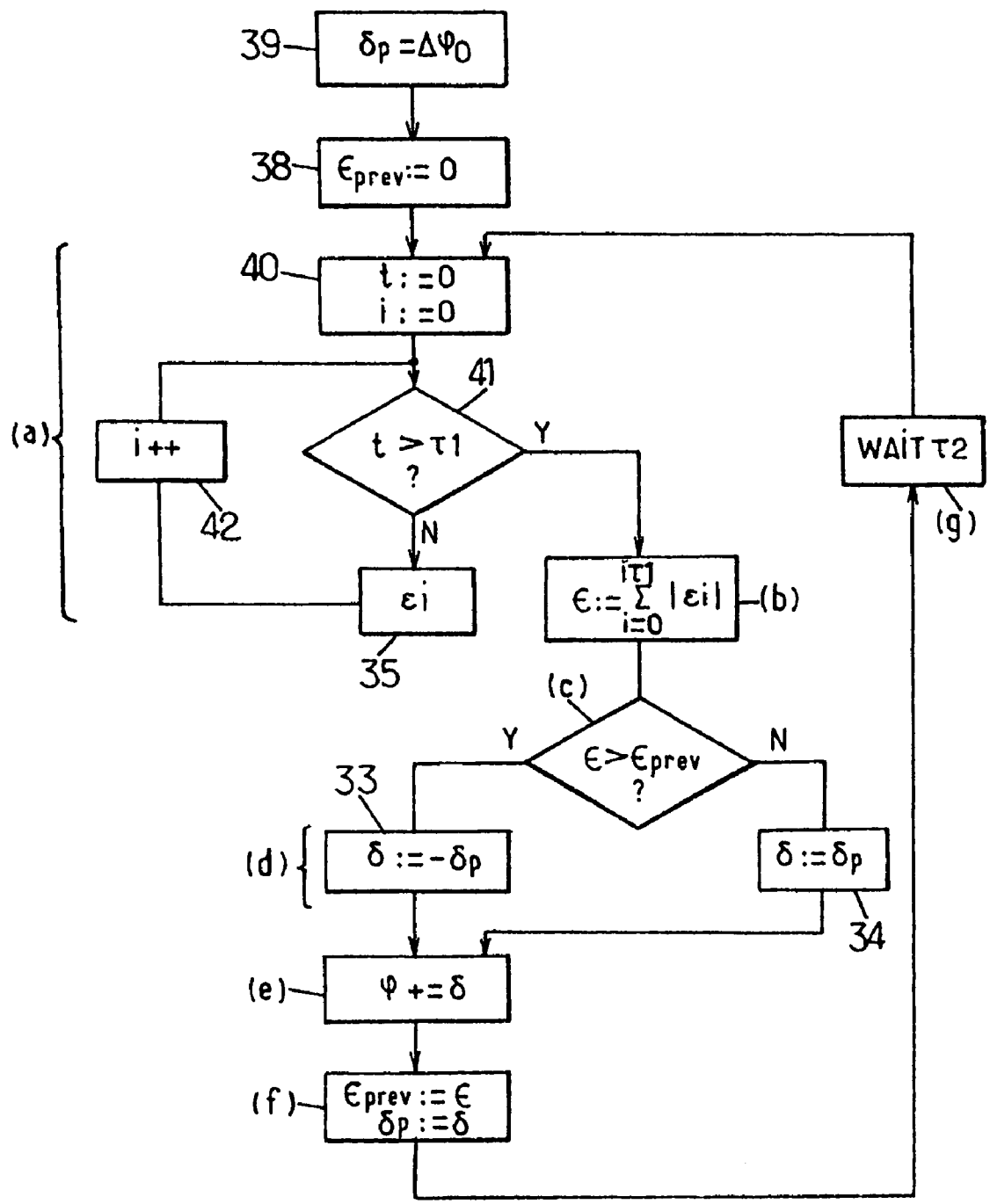
FIG. 2 shows an example of phase correction method according to an embodiment of the present invention.

FIG. 2 shows an example of mismatch correction algorithm according to an embodiment of the invention.

This method comprises a step (b) for determining the current value of a second error E. The current value of this second error E is compared with the previous second error value $E_{prev}$ (step (c)). The value of a current phase shift correction $\delta$ is chosen (step (d)) from two phase shift correction values $(-\delta_p, +\delta_p)$ according to the result of the comparison and according to the value of a previous phase shift correction $\delta_p$. The value of the current phase shift correction $\delta$ chosen is added to a previous phase shift $\phi$ (step (e)), to obtain the value of a current phase shift. This current phase shift is introduced between a digital signal in phase and a digital signal in quadrature, for example with a table and a phase recovery circuit.

These steps are intended to typically be repeated at regular intervals. The algorithm may provide a wait (step (g)) for a second period $T_2$ between two execution cycles, this second period $T_2$ possibly being zero or modified.

In a first cycle, the algorithm may provide for initiation steps (39, 38).

The previous phase correction value $\delta_p$ is thus initialized (step 39) to a certain value $\Delta\phi_0$. In the example represented, this certain value $\Delta\phi_0$ corresponds to the desired phase shift interval. The higher the $\Delta\phi_0$ value, the faster the convergence.

Similarly, the previous second error value $E_{prev}$ is initialized (step 38), for example to zero. Alternatively, this first previous second error value is measured before the first cycle is executed.

The first cycle comprises a step (a) for measuring a set of first error values $\epsilon_i$ during a first period $T_1$.

In this example, the measurements (step 35) take place during the first period $T_1$. To this end, the step (a) comprises a loop on an index i, with loop initiation 40, test 41 and incrementation 42 steps.

Alternatively, first errors are measured permanently and the set of first error values $\epsilon_i$ comprises the first error values $\epsilon_i$ measured during the first period $T_1$, as in the device of FIG. 1.

The first error values $\epsilon_i$ of the set of first error values are summed (step (b)) in order to determine the current second error value E. In this example, the absolute values of the first errors $\epsilon_i$ are summed.

This current second error value E is compared with the previous second error value $E_{prev}$ (step (c)). In the first cycle, with a zero previous second error value $E_{prev}$, the algorithm represented results in the choice (step 33) of the opposite of the previous phase shift correction value $\delta_p$ as the current phase shift correction value $\delta$, or $-\Delta\phi_0$. The phase shift interval $\Delta\phi_0$ is therefore subtracted from the current phase shift $\phi$ (step (e)).

Before the execution of the step (e), the current phase shift $\phi$ may have an arbitrarily chosen value. This value may be zero.

After the execution of the step (e), the phase shift is introduced between the I and Q channels.

The current second error value E is stored as previous second error value $E_{prev}$ and the current phase shift correction value $\delta$ is stored as previous phase shift correction $\delta_p$ (step (f)).

After the execution of the step (g) waiting for the second period $T_2$, a new cycle may recommence.

The term "current" is used to mean the current cycle, whereas "previous" is used to mean a previous cycle, or an initialization.

In this new cycle, the previous second error value $E_{prev}$ is compared with the current second error value E, measured in the new cycle.

If the current second error value E is higher than the previous second error value $E_{prev}$, measured in the first cycle, it is estimated that the phase shift correction introduced has not contributed to compensating for the actual phase shift between the signals of the I and Q channels. It is estimated, on the contrary, that the phase shift correction introduced has aggravated the actual phase shift between the signals of the I and Q channels. Consequently, the current phase shift correction value $\delta$ is chosen to be equal to the opposite of the previous phase shift correction $\delta_p$ (step 33).

Alternatively, it is possible to arrange in the step 33 for the current phase shift correction value $\delta$ to be chosen to be equal to twice the opposite of the previous phase shift correction $\delta_p$. This avoids the loss of a cycle to return to a status quo situation.

If the current second error value E is lower than the previous second error value $E_{prev}$, measured in the first cycle, it is estimated that the phase shift interval introduced has contributed to compensating for the actual phase shift between the signals of the I and Q channels. Consequently, the current phase shift correction value δ is chosen to be equal to the previous phase shift correction $\delta_p$ (step 34).

Periodical repetition of these cycles allows converging towards a phase shift value close to the actual phase shift between the I and Q channels.

Example of Phase Correction

Figure 3A:
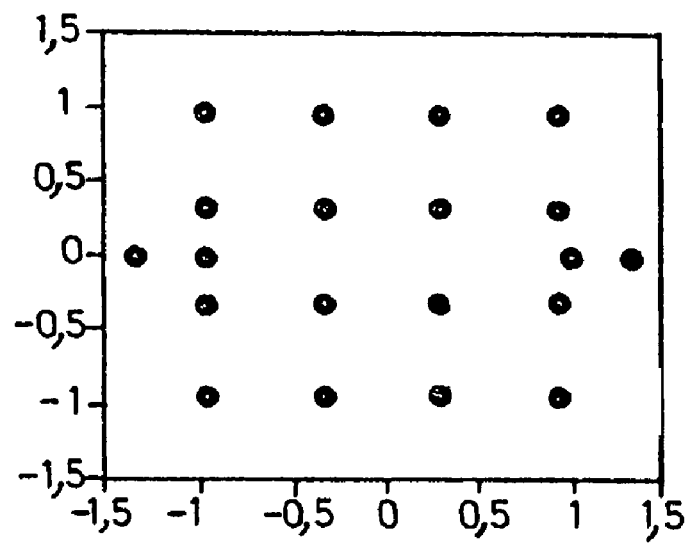
FIG. 3A shows an example of constellation of symbols estimated without phase correction.

FIG. 3A shows an example of constellation of symbols estimated without phase correction. The actual phase shift between the I and Q channels is 2.2 degrees. A set of spots may be observed: the estimated symbols are only near to the theoretical symbols.

Figure 3B:
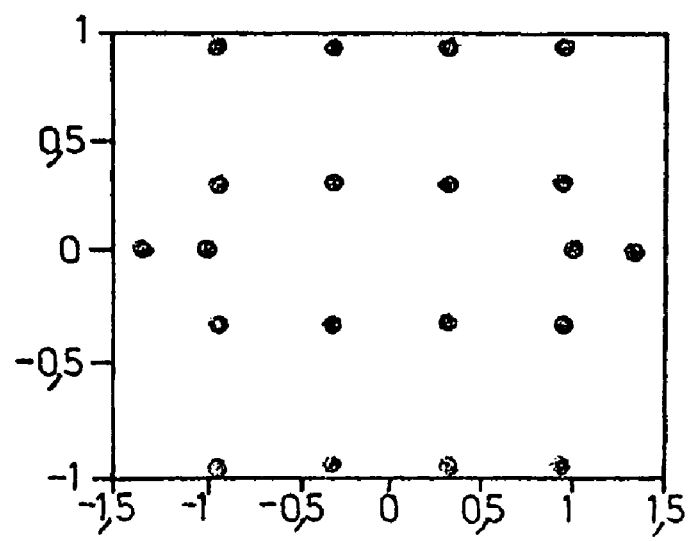
FIG. 3B shows an example of constellation of symbols estimated with a phase correction according to an embodiment of the present invention of 0.5 degrees.
Figure 3C:
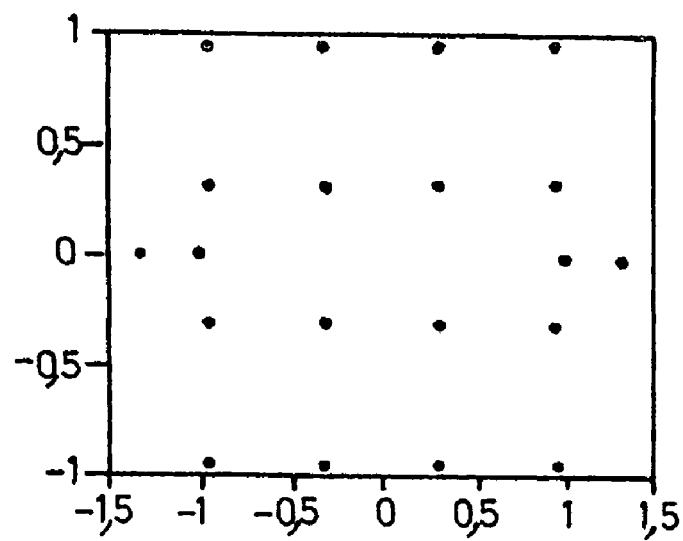
FIG. 3C shows an example of constellation of symbols estimated with a phase correction according to an embodiment of the present invention of 2 degrees.
Figure 3D:
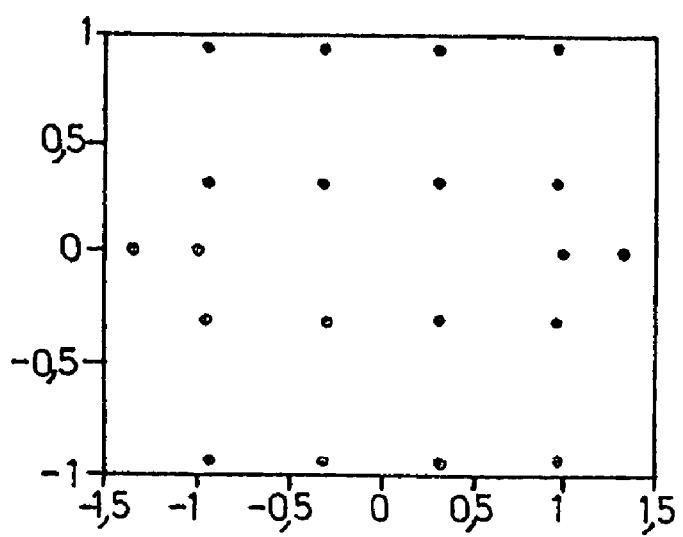
FIG. 3D shows an example of constellation of symbols estimated with a phase correction according to an embodiment of the present invention of 2.5 degrees.

When a phase correction algorithm such as the one in FIG. 2 is applied to such signals, this state of affairs may be improved, as is shown by the constellations of FIGS. 3B, 3C and 3D.

A zero initial phase shift is chosen, and a phase shift interval of 0.5 degrees. After the execution of a first cycle, a phase shift of +0.5 degrees has been introduced between the I and Q channels. As shown by the constellation of FIG. 3B, the spots are smaller than the spots of FIG. 3A.

Also, on the execution of a second cycle, it is deemed that the phase shift of +0.5 degrees improves the correction of the mismatches between the I and Q channels. A new phase shift correction of 0.5 degrees is introduced, i.e., a phase shift of 1 degree.

Other cycles are executed and the phase shift introduced nears the actual phase shift. As is shown by FIGS. 3C and 3D, the spots are roughly similar for a phase shift introduced of 2 degrees (FIG. 3C) and for a phase shift introduced of 2.5 degrees (FIG. 3D).

When these values are reached, the estimated symbols are relatively close to the theoretical symbols.

Variants

With an algorithm such as the one in FIG. 2, the phase shift introduced will oscillate about the actual phase shift.

The value of the second period may increase when a certain number of cycles have been executed. In practice, it may be estimated that after a certain number of cycles, the value of the phase shift introduced is relatively close to the value of the actual phase shift. The cycles may therefore be executed less frequently, for monitoring purposes.

Also, the value of the phase shift interval $\Delta\phi_0$ may be relatively high when executing the first cycles, then lower. In practice, the actual phase shift may be relatively different from the phase shift value chosen arbitrarily, such that a relatively high phase shift interval allows a faster convergence towards the actual phase shift value.

Figure 5:
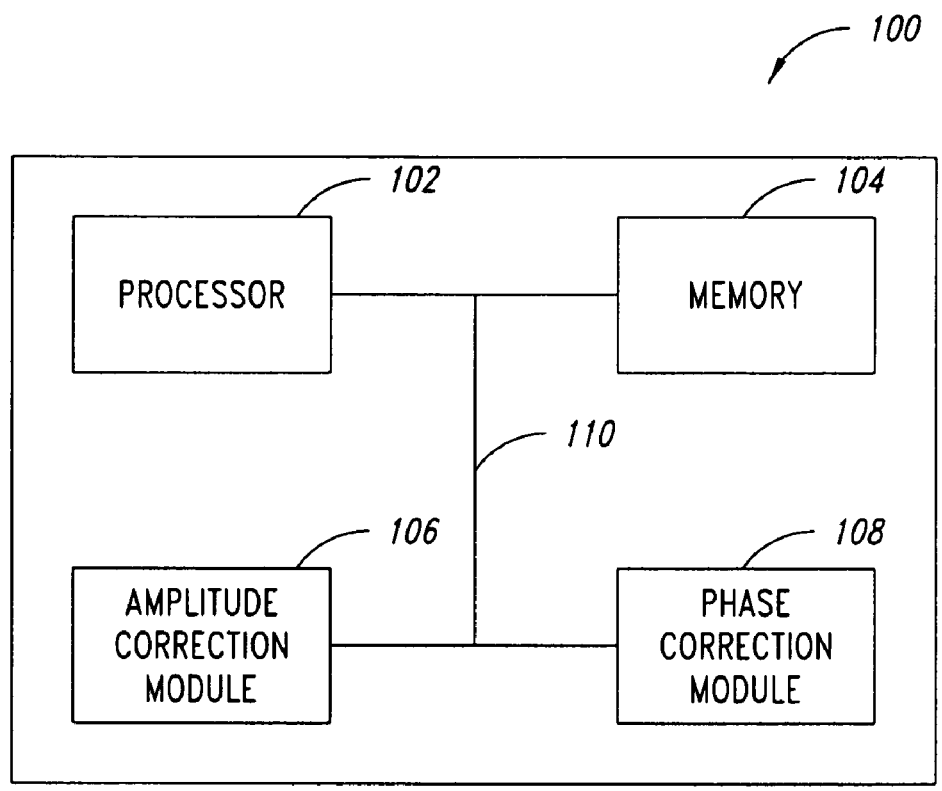
FIG. 5 is a functional block diagram of a terrestrial broadcast signal receiver according to an embodiment of the present invention.

FIG. 5 is a functional block diagram of a system 100 according to an embodiment of the invention. The system 100 comprises a processor 102, a memory 104, an amplitude correction module 106, a phase correction module 108, and a bus system 110.

The amplitude correction module generates an amplitude correction value for use in correcting amplitude mismatches between the signal in phase and the signal in quadrature. In one embodiment the amplitude correction module is configured to measure an amplitude of one of the signal in phase and the signal in quadrature and generate an amplitude correction value based on the stored historical signal correction data and the measured amplitude. The phase correction module generates a phase correction value for use in correcting errors in the phase difference between the signal in phase and the signal in quadrature. In one embodiment the phase correction module is configured to measure a plurality of first phase error values, generate a current second phase error value based on the first phase error values, and generate a current phase correction value based on the stored historical signal correction data and the current second phase error value.

In one embodiment the amplitude correction module 106 and the phase correction module 108 may be implemented as discreet circuitry designed to perform their stated functions.

In one embodiment the amplitude correction module 106 and the phase correction module 108 may be implemented in the form of a program stored in the memory 104 and executed by the processor 108.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method, comprising:
   correcting mismatches between a digital signal in phase and a digital signal in quadrature, respectively on a channel in phase and a channel in quadrature, originating from a signal broadcast by terrestrial channel, by,
      measuring a set of first error values during a first period, each value being measured based on an estimated symbol originating from the broadcast signal and a theoretical symbol nearest to the estimated symbol;
      determining a current value of a second error based on a sum of the first error values of the set of first error values;
      comparing the current second error value with a previous second error value stored in memory;
      choosing a value of a current phase shift correction to be added to a previous phase shift introduced between the digital signal in phase and the digital signal in quadrature, the choice being made from at least two phase shift correction values, based on the result of the comparison, and the value of a previous phase shift correction stored in memory;
      adding the current phase shift correction value chosen to the previous phase shift to obtain a current phase shift;
      introducing the current phase shift obtained between the digital signal in phase and the digital signal in quadrature;
      storing in memory the current second error value and the current phase shift correction value; and
      repeating the above steps.

2. The method according to claim 1 wherein the choice of the current phase shift correction value is made from two phase shift correction values, of signs opposite to each other.

3. The method according to claim 1, further comprising waiting for a second period.

4. The method of claim 1 wherein the first period is such that the set of first error values comprises at least four first error values.

5. The method according to claim 1, further comprising correcting the amplitude, by performing the steps of:
   assessing a power for each channel;
   comparing the powers assessed;
   choosing a gain correction value from at least two gain correction values, based on a comparison result;

for at least one of the channels, determining a current gain to be applied to the channel, based on a previous gain applied to the channel, and the gain correction value chosen;

for each channel for which the current gain has been determined, applying said current gain to said channel; and repeating the amplitude correction steps.

6. A device to correct mismatches between a digital signal in phase and a digital signal in quadrature, respectively on a channel in phase and a channel in quadrature, originating from a signal broadcast by terrestrial channel and intended for a device for estimating symbols based on the digital signal in phase and the digital signal in quadrature, the correction device including a phase correction device, wherein the phase correction device comprises:

a memory configured to store a value of a previous phase shift correction and a previous value of a second error;

a measuring device configured to measure first error values between an estimated symbol and a theoretical symbol nearest to the estimated symbol;

a summing device configured to determine a current value of a second error based on a sum of the first error values measured during a first period;

a comparator configured to compare the current second error value with the previous second error value stored in memory;

a phase-shift correction selector configured to choose a value of a current phase shift correction to be added to a previous phase shift introduced between the digital signal in phase and the digital signal in quadrature, the choice being made from at least two phase shift correction values, based on the result of the comparison and on the previous phase shift correction value stored in memory; and a phase shifter configured to introduce a current phase shift between the digital signal in phase and the digital signal in quadrature, the current phase shift being dependent on the previous phase shift and the current phase shift correction value.

7. The device of claim 6, further comprising a first timer coupled to the summing device, wherein the summing device is configured to use a signal provided by the first timer to control the summing of the first error values during a first period.

8. The device according to claim 7, further comprising:

a second timer coupled to the summing device, wherein the summing device is configured to enable summing of the first error values based on an indication from the second timer that a second period has passed.

9. The device according to claim 6, further comprising a channel estimator located upstream from the measuring device.

10. The device according to claim 6, further comprising an amplitude correction device having:

a plurality of power calculation devices, wherein each power calculation device is configured to assess a power on one of the channels;

a second comparator configured to compare the powers assessed by the power calculation devices;

a gain distributor coupled to the second comparator and configured to choose a gain correction value from at least two gain correction values; and a plurality of multipliers, each multiplier being located on one of the channels upstream from the corresponding power calculation device, a gain of each multiplier being determined by the gain distributor based on a previous gain corresponding to this multiplier and on the chosen gain correction value.

11. An electronic device for processing components in phase and in quadrature, respectively on a channel in phase and a channel in quadrature, originating from signals broadcast by terrestrial channel, comprising:

a device for estimating symbols based on a digital signal in phase and a digital signal in quadrature respectively corresponding to the component in phase and the component in quadrature; and a device for correcting mismatches between the digital signal in phase and the digital signal in quadrature, the correction device including a phase correction device, wherein the phase correction device comprises:

means for storing a value of a previous phase shift correction and a previous value of a second error;

a device for measuring first error values between an estimated symbol and a theoretical symbol nearest to the estimated symbol;

summing means for determining a current value of a second error based on a sum of the first error values measured during a first period;

first comparison means for comparing the current second error value with the previous second error value stored in the means for storing;

choosing means for choosing a value of a current phase shift correction to be added to a previous phase shift introduced between the digital signal in phase and the digital signal in quadrature, the choice being made from at least two phase shift correction values, based on the result of the comparison, and on the previous phase shift correction value stored in the means for storing; and phase shifting means for introducing a current phase shift between the digital signal in phase and the digital signal in quadrature, the current phase shift being dependent on the previous phase shift and the current phase shift correction value.

12. The electronic device according to claim 11, wherein the phase correction device further comprises first counting means controlling the summing means.

13. The electronic device according to claim 11, wherein the phase correction device comprises second counting means controlling the summing means.

14. The electronic device according to claim 11, further comprising channel estimation means located upstream from the measuring device.

15. The device according to claim 11, further comprising an amplitude correction device having:

a plurality of calculation devices, wherein each power calculation device is configured to assess a power on one of the channels;

second comparison means for comparing the powers assessed by the power calculation devices;

gain distribution means linked to the second comparison means, for choosing a gain correction value from at least two gain correction values; and a plurality of multipliers, each multiplier being located on one of the channels upstream from the corresponding power calculation device, a gain of each multiplier being determined by the gain distribution means based on a previous gain corresponding to this multiplier and on the chosen gain correction value.

16. A device, comprising:
  a tuner configured to receive signals in baseband and output a component in phase on a channel in phase and a component in quadrature on a channel in quadrature;
  an electronic device configured to estimate symbols based on a digital signal in phase and a digital signal in quadrature respectively corresponding to the component in phase and the component in quadrature; and
  a correction device configured to correct mismatches between the digital signal in phase and the digital signal in quadrature, the correction device including a phase correction device having:
    a memory configured to store a value of a previous phase shift correction and a previous value of a second error;
    a measuring device configured to measure first error values between an estimated symbol and a theoretical symbol nearest to the estimated symbol;
    a summing device configured to determine a current value of a second error based on a sum of the first error values measured during a first period;
    a first comparator configured to compare the current second error value with the previous second error value stored in memory;
    a chooser configured to choose a value of a current phase shift correction to be added to a previous phase shift introduced between the digital signal in phase and the digital signal in quadrature, the choice being made from at least two phase shift correction values, based on the result of the comparison and on the previous phase shift correction value stored in memory; and
    a phase shifter configured to introduce a current phase shift between the digital signal in phase and the digital signal in quadrature, the current phase shift being dependent on the previous phase shift and the current phase shift correction value.

17. The device according to claim 16, wherein the device is implemented in hybrid technology.

18. A system, comprising:
  a memory configured to store historical signal correction data to correct mismatches between in phase and in quadrature signals;
  an amplitude corrector; and
  a phase corrector configured to:
    measure an error between an estimated symbol and a theoretical symbol nearest the estimated symbol to generate a plurality of first phase error values;
    generate a current second phase error value based on the first phase error values; and
    generate a current phase correction value based on the stored historical signal correction data and the current second phase error value.

19. The system according to claim 18 wherein the amplitude corrector is configured to:
  measure an amplitude of one of the signal in phase and the signal in quadrature; and
  generate an amplitude correction value based on the stored historical signal correction data and the measured amplitude.

20. A method, comprising:
  correcting mismatches between a signal in phase and a signal in quadrature by,
    storing historical signal correction data in a memory;
    generating an amplitude correction value; and
    generating a phase correction value by:
      measuring an error between an estimated symbol and a theoretical symbol nearest the estimated symbol to generate a plurality of first phase error values;
      calculating a second phase error value based on the first phase error values; and
      generating a current phase correction value based on the stored historical signal correction data and the second phase error value.

21. The method according to claim 20 wherein generating an amplitude correction value comprises:
  measuring an amplitude of one of the signal in phase and the signal in quadrature; and
  choosing a current amplitude correction value based on the measured amplitude and the stored historical signal correction data.

22. The method according to claim 20, further comprising generating a subsequent phase correction value.

23. The method of claim 20 wherein generating a current phase correction value based on the stored historical signal correction data and the second phase error value comprises comparing the second phase error value with a stored second phase error value in the stored historical signal correction data.

24. The system of claim 18 wherein the phase corrector is configured to generate the current phase correction value based on a comparison of a stored second phase error value in the stored historical signal correction data and the current second phase error value.

* * * * *